(12) United States Patent
Zamoshchik et al.

(10) Patent No.: US 11,746,421 B2
(45) Date of Patent: Sep. 5, 2023

(54) METHOD FOR METAL LAYER FORMATION

(71) Applicant: OrelTech Ltd., Rehovot (IL)

(72) Inventors: Natalia Zamoshchik, Rehovot (IL); Konstantin Livanov, Rehovot (IL); Yana Sheynin, Rehovot (IL)

(73) Assignee: ORELTECH LTD., Rehovot (IL)

( * ) Notice: Subject to any disclaimer, the term of this patent is extended or adjusted under 35 U.S.C. 154(b) by 53 days.

(21) Appl. No.: 16/519,673

(22) Filed: Jul. 23, 2019

(65) Prior Publication Data

US 2020/0017974 A1 Jan. 16, 2020

Related U.S. Application Data

(63) Continuation of application No. PCT/US2018/014945, filed on Jan. 24, 2018.

(60) Provisional application No. 62/449,882, filed on Jan. 24, 2017.

(51) Int. Cl.
| | | |
|---|---|---|
| *C23C 18/14* | (2006.01) | |
| *C23C 18/16* | (2006.01) | |
| *C23C 18/31* | (2006.01) | |
| *C09D 11/52* | (2014.01) | |
| *B22F 1/18* | (2022.01) | |

(52) U.S. Cl.
CPC ............ *C23C 18/145* (2019.05); *C09D 11/52* (2013.01); *C23C 18/1671* (2013.01); *C23C 18/1682* (2013.01); *C23C 18/31* (2013.01); *B22F 1/18* (2022.01)

(58) Field of Classification Search
None
See application file for complete search history.

(56) References Cited

U.S. PATENT DOCUMENTS

| | | | |
|---|---|---|---|
| 6,068,800 A | 5/2000 | Singh et al. | |
| 7,258,899 B1 * | 8/2007 | Sharma | C23C 18/08 427/535 |
| 2009/0004370 A1 * | 1/2009 | Zurcher | C09D 11/38 427/123 |
| 2010/0247798 A1 * | 9/2010 | Chung | C09D 11/30 427/535 |
| 2016/0258048 A1 * | 9/2016 | Zamoshchik | B41M 5/0023 |

FOREIGN PATENT DOCUMENTS

| | | | |
|---|---|---|---|
| CN | 107002218 A | 8/2017 | |
| EP | 1323846 A2 | 7/2003 | |
| EP | 3025811 | 4/2017 | |
| KR | 2013138978 A * | 12/2013 | ............ B22F 1/0018 |
| WO | WO-2006076611 A2 * | 7/2006 | ................ B22F 9/24 |
| WO | 2006093398 A1 | 9/2006 | |
| WO | WO-2013128449 A2 * | 9/2013 | ......... H01B 13/0026 |
| WO | 2016064858 A1 | 4/2016 | |

OTHER PUBLICATIONS

CAS Registry. CAS Registry No. 68-12-2 [Scifinder] Dimethylformamide (Year: 2021).*
National Center for Biotechnology Information (2021). PubChem Compound Summary for CID 6228, N,N-Dimethylformamide. Retrieved Jan. 15, 2021 from https://pubchem.ncbi.nlm.nih.gov/compound/N_N-Dimethylformamide (Year: 2021).*
National Center for Biotechnology Information (2021). PubChem Compound Summary for CID 702, Ethanol. Retrieved Jan. 15, 2021 from https://pubchem.ncbi.nlm.nih.gov/compound/Ethanol (Year: 2021).*
MeGlobal. Ethylene glycol product guide (2013), p. 7, found at https://www.meglobal.biz/wp-content/uploads/2019/01/Monoethylene-Glycol-MEG-Technical-Product-Brochure-PDF.pdf (Year: 2013).*
Monument Chemical. Propylene Glycol Technical Product Information (2018), found at https://monumentchemical.com/uploads/files/TDS/PG%20-%20TDS.pdf (Year: 2018).*
National Center for Biotechnology Information (2021). PubChem Compound Summary for CID 3776, Isopropyl alcohol. Retrieved Nov. 5, 2021 from https://pubchem.ncbi.nlm.nih.gov/compound/Isopropyl-alcohol. (Year: 2021).*
Ravdel, et al., "Brief Handbook of Physical and Chemical Values", Chemistry, 1974, 200 Pages.
The International Search Report and the Written Opinion of the International Searching Authority, dated May 17, 2018, ISA, RU, Moscow, Russia.
The European Search Report for European Patent Application No. 18744788.3, dated Nov. 23, 2020, EPO, Munich, Germany.
The Second Office Action for Chinese Patent Application No. 2018800184976 in the name of OrelTech Ltd., dated Jul. 22, 2021.
The First Office Action for Chinese Patent Application No. 2018800184976 in the name of OrelTech Ltd., dated Feb. 4, 2021.
The Third Office Action for Chinese Patent Application No. 2018800184976 in the name of OrelTech Ltd., dated Dec. 2, 2021.

* cited by examiner

*Primary Examiner* — Jose I Hernandez-Kenney
(74) *Attorney, Agent, or Firm* — M&B IP Analysts, LLC

(57) ABSTRACT

A method for forming a crystalline metal layer on a three-dimensional (3D) substrate is provided. The method includes applying crystal growth ink to a surface of the 3D substrate, wherein the crystal growth ink includes a metal ionic precursor and a structuring liquid; and exposing the 3D substrate to plasma irradiation from plasma in a vacuum chamber to cause the growing of a crystalline metal layer on the 3D substrate, wherein the exposure is based on a set of predefined exposure parameters.

30 Claims, 5 Drawing Sheets

METHOD FOR METAL LAYER FORMATION

CROSS-REFERENCE TO RELATED APPLICATIONS

This application is a continuation of International Application No. PCT/US2018/014945 filed on Jan. 24, 2018, which claims the benefit of U.S. Provisional Application No. 62/449,882 filed on Jan. 24, 2017, the contents of which are hereby incorporated by reference.

TECHNICAL FIELD

The present disclosure relates generally to methods for the formation of metal layers on three-dimensional (3D) surfaces.

BACKGROUND

The formation and application of a metal layer (i.e., metallizing) on complex 3D surfaces is a rising necessity in a modern world. Metallic coatings are commonly applied to objects for decorative, protective, or functional purposes, or any combination thereof. A particular emphasis has been put on metallizing plastic, thermally unstable surfaces, and non-conductive 3D surfaces, where the procedure is particularly challenging as current metallizing methods are inefficient and costly for these materials.

Modern methods of 3D surface metallizing can be divided into four broad categories. The first category includes electroplating, electroless deposition, conversion coating and anodizing methods. Such methods typically use electrolyte solutions and electric currents to reduce dissolved metal cations, which form thin metal layers on a substrate. Electroplating is mainly applied to modify the surface properties of a substrate, such as wear resistance, corrosion protection, lubricity, and certain aesthetic qualities. Advantages of the electroplating method and the like include precise control over the applied layer's thickness and morphology, uniform deposition, high deposition rates and relatively low cost, both of materials and equipment. However, applications of the electroplating method and the like is only possible when applied to conductive substrates.

A second category of metallizing substrates is vapor deposition, which includes a broad variety of methods such as Plasma Vapor Deposition (PVD), Chemical Vapor Deposition (CVD), Ionic Plasma Deposition (IPD), thermal spraying, and the like. In general, this category includes methods that use low pressures, high temperatures, or aggressive chemical environments to deposit a metal layer on a desired surface. For example, a PVD method utilizes a physical process, such as heating or sputtering, to produce a vapor of metal, which is then deposited on the substrate. In a CVD process, the substrate is exposed to highly reactive reagents in the reaction chamber. Such methods are inexpensive and can be executed quickly, but can be harmful to many types of substrates, specifically organic ones. In addition, such methods are inefficient in terms of material and power usage.

A third category includes such distinct methods as painting, spin-coating, dip-coating and similar techniques that deposit a metal layer in a liquid form on a substrate and then thermally or chemically process the layer. This category is advantageous in its simplicity. These methods rarely require complicated equipment, are material efficient and are easily executed. However, methods within this third category are often unsuitable for mass production due to coating rates and limited control over layer thickness and other layer properties.

A fourth category includes all types of printing and subsequent treatment of printed inks on a substrate to obtain a metallic layer. The printing process may include inkjet, flexography, screen printing and microstamping, where the treatment is typically thermal. This category is the most popular in organic electronics due to its high printing rates, relative simplicity of required equipment, and low material losses. Printing, however, is usually not possible for non-flat, curved, or more complicated surfaces, such as fibers, wires, papers, fabrics, particles or powders. These types of objects have to be metallized using one of the first two broad categories, which often lead to significant material losses and substrate damage due to their required extreme conditions (e.g., high temperature or caustic chemical environment).

The desire for metallizing complex objects and materials is become more prevalent. The applications for such procedures include, but are not limited to, device such as 3D antennas, conductive composites, "smart" electronic wearables, catalysts and more.

It would therefore be advantageous to provide a solution that would overcome the challenges noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "certain embodiments" may be used herein to refer to a single embodiment or multiple embodiments of the disclosure.

Certain embodiments disclosed herein include a method for forming a crystalline metal layer on a three-dimensional (3D) substrate. The method includes applying crystal growth ink to a surface of the 3D substrate, wherein the crystal growth ink includes a metal ionic precursor and a structuring liquid; and exposing the 3D substrate to plasma irradiation from plasma in a vacuum environment to cause the growing of a crystalline metal layer on the 3D substrate, wherein the exposure is based on a set of predefined exposure parameters.

Certain embodiments disclosed herein also include a crystal growth ink, which includes a metal ionic precursor and a structuring liquid, where the crystal growth ink, when applied on a surface of the 3D substrate and exposed to plasma irradiation from plasma in a vacuum environment, causes the growth of a crystalline metal layer on the 3D substrate, where the exposure is based on a set of predefined exposure parameters

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figure 1:
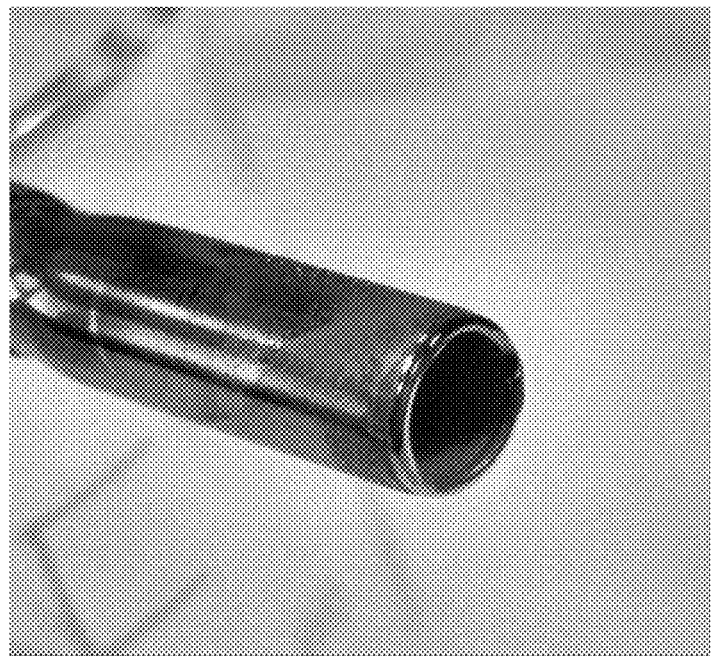
FIG. 1 is a photograph image of a gold layer formed on the inside and outside of a curved glass tube using the disclosed process.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

The various disclosed embodiments include a method and process for metallizing objects, including 3D substrates that are curved or have non-planar surfaces. The process, disclosed according to an embodiment, includes applying a crystal growth ink to a substrate and exposing the coated substrate to irradiation from plasma within a vacuum environment. The irradiation causes a reduction process in the crystal growth ink where metal ions within the ink receive electrons from the plasma and are converted to metal atoms, resulting in the formation of a crystalline metal layer on the substrate.

The versatility of the disclosed process allows it to be applied to substrates with variously shaped surfaces. Examples of such objects include glass fibers, carbon fibers, polymer wires, polymer threads, papers, fabrics, textiles, nonwovens, polymer or ceramic microparticles, polymer or ceramic nanoparticles, powders and various composite devices for catalytic, electronic and optoelectronic applications.

In one embodiment, the crystal growth ink composition includes a metal ionic precursor, comprising between 0.01% and 60% by weight of the crystal growth ink. The formulation of the crystal growth ink includes the following: a structuring liquid, a spreading liquid, and a stabilizing liquid. In an embodiment, additives are additionally included in the ink formulation. Each of the ingredients may be an organic solvent or a combination of organic solvents, which differ by their role in the ink formulation and in their physical properties. The composition of the crystal growth ink may be in the form of a solution, a dispersion, a suspension, a gel, or a colloid.

The metal ionic precursor of the crystal growth ink may be composed of a mixture of salts including one or more metal cations (i.e., positively charged ions) and counterions (i.e., ions having a charge equal to the cations, but negative). In an embodiment, the metal cations may be stabilized by either a counterion or a ligand, forming an organometallic complex, such that the resulting salt is connected by coordinate bonds rather than by ionic bonds.

The metal cations may be in the form of an organic or inorganic salt of at least one of the following elements: Au, Ag, Pt, Pd, Cu, Ni, Co, Zn, In, Ti, V, Mn, Fe, Cr, Zr, Nb, Mo, W, Ru, Rh, Ca, Re, Os, Ir, Al, Ga, Sn, and Sb, and their combinations. Their salts may form metallic or bimetallic nanocrystals.

The counterions of the metal ionic precursor may be $M(NO_3)_n$, $M(SO_4)_n$, $MCl_n$, $H_mMCl_{n+m}$, and MN, where "M" is a metal atom, or metal alloy, with a valence of "n", H is hydrogen, $NO_3$ is nitrate, $SO_4$ is sulfate, Cl is chloride, "N" is alkyl-, alyl-, aceto-, carbonyl, carboxyl, cyclopentadienyl, phenyl-, biphenyl-, pyridine-, bipyridine-, aromatic, cyano-, amide and other organic moieties, and "m" is a valence of the counterion.

The structuring liquid part of the crystal growth ink assists the growth of metal nanocrystals with structure and form, and makes up above 20% by weight of the crystal growth ink. In an embodiment, the structuring liquid may include any one of or combination of: cyclic alcohols, sulfoxides, formamides, ethylamines, diols, glycols, glycol ethers, glycerol, propylene carbonate, and their derivatives. This liquid is stable, does not evaporate quickly and has a high viscosity to ensure even and uniform crystal growth on a substrate.

The structuring liquid evaporates during plasma exposure under the combined effect of plasma irradiation and low to medium pressure in the range of $1\times10^4$ Pa to $1\times10^{-1}$ Pa. Hence the need for a vacuum environment for this process. In some embodiments, the structuring liquid evaporates under the effect of plasma irradiation of plasma gas at atmospheric to low pressure ($1\times10^5$ Pa to $1\times10^4$ Pa).

In an embodiment, the structuring liquid has a dynamic viscosity between 10-1000 centipascals (cP), a vapor pressure between 0-100 pascals (Pa), or both. The structuring liquid is important in the metallization of 3D objects, since it ensures crystal growth on the surfaces to which it is applied.

The spreading liquid part of the crystal growth ink provides the crystal growth ink with desirable wetting and flowing parameters to ensure that it sufficiently covers the substrate surface. In cases when crystal growth ink application to the surface is done via printing, the stabilizing liquid also ensures flow through the printer head. In an embodiment, the spreading liquid part makes up between 0 and 80% by weight of the crystal growth ink. The spreading liquid is usually volatile, evaporates quickly, and has low surface tension to ensure good wetting on the substrate surface. Typically, the spreading liquid has a surface tension of 10-40 millinewtons per meter (mN/m). In an embodiment, the spreading liquid is at least one of: alcohol, toluene, dioxane, sulfoxides, formamides, ethylamines, glycol ethers, acetonitrile and their derivatives.

The stabilizing liquid part of the crystal growth ink provides stability for the metal ionic precursor and prevents sedimentation within the solution, dispersion, suspension, gel, or colloid. In an embodiment, the stabilizing liquid makes up between 0 and 50% by weight of the crystal growth ink. The stabilizing liquid may be polar with good solvent properties, and is able to dissolve the metal ionic precursor between 5-300 grams per 100 grams of the solvent. In an embodiment, the stabilizing liquid includes at least one of: water, tetrahydrofurane, dioxane, cyclic alcohols, sulfoxides, formamides, ethylamines, glycols, glycerol, propylene carbonate, acetonitrile and their derivatives.

In further embodiments, the crystal growth ink contains additives including, but not limited to, solvents, organic molecules, oxidants, reductants, acids, bases, stabilizers, polymers, conductive polymers, microparticles, nanoparticles, carbon nanotubes (CNT), densifiers, surfactants, propellants, dispersing agents, binder resins, adhesion promoters, wetting agents, leveling agents and the like. Such additives can be used to affect the viscosity or other parameters of the crystal growth ink formulation, and make up between 0 and 5% by weight of the crystal growth ink.

The disclosed method includes applying the crystal growth ink to a substrate, such as a 3D substrate, by various means including, but not limited to, drop-casting, spray-coating, immersion, printing, mixing, soaking and the like. In order for the process to work, the thickness of the crystal growth ink on the substrate should not exceed 2 millimeters. The coated substrate is then exposed to irradiation from plasma in a vacuum environment. The plasma used for the irradiation includes partially ionized gas that is not in thermodynamic equilibrium, such as radio frequency (RF) plasma. Often, such plasma can exist at relatively low temperatures. The use of plasma enables the conduction of a chemical reaction without exposing the surface of the substrate to high temperatures, which may damage or otherwise harm the surface or the layers below the surface of the substrate.

The plasma may include a gas such as argon, nitrogen, oxygen, hydrogen, air, helium, neon, xenon, ammonia, ethane ($C_2H_6$), carbon dioxide, carbon monoxide, methane ($CH_4$), propane ($C_3H_8$), silane ($SiH_4$), nitrogen dioxide, nitrogen monoxide and their combinations. To this end, the substrate is placed in a chamber and exposed to gas plasma as determined by a set of exposure parameters including, but not limited to, power, frequency, and time duration of the exposure. The values of the exposure parameters are determined, based in part, on the process chamber dimensions, type of the substrate, the composition of the crystal growth ink, the amount of the crystal growth ink and the means of the application of the crystal growth ink.

In an embodiment, the values of the exposure parameters fall within the following ranges: plasma power, plasma generator frequency between 50 Hz and 5 GHz, and an exposure time. The generator power depends on the volume of the chamber, the amount of crystal growth ink, plasma frequency and 3D substrate surface area. The exposure time depends on the amount of crystal growth ink, its composition, plasma power and 3D substrate area.

As the substrate coated with crystal growth ink is exposed to the plasma, the metal ionic precursor therein reacts with the plasma, resulting in its electrochemical reduction. During the reduction process, the majority of the liquid part (structuring liquid, spreading liquid, stabilizing liquid and additive) of the ink evaporates, and metal ions receive electrons from the plasma and are converted into metal atoms. These processes occur simultaneously. In an embodiment, at least 95% of the liquid within the crystal growth ink evaporates during the reduction process. The metal atoms assemble into a nanocrystalline spread that adheres to the substrate. The resulting nanocrystals may remain separate entities, or combine to form larger clusters, interconnected semi- or fully crystalline networks, and, ultimately, uniform metal polycrystalline layers.

In some embodiments, the final stage of crystal growth is a fully metallized substrate, i.e., a substrate covered with a full, uniform, and conductive metal layer. In a further embodiment, the process results in nanocrystals spread across the substrate, where the final layer may or may not be conductive. The extent of the crystal growth and the shape and size of the formed nanocrystals or clusters of nanocrystals are determined by various factors, including, but not limited to, the metal ionic precursor concentration within the crystal growth ink, the composition of the crystal growth ink, the plasma exposure parameters, the substrate material and shape, and the like. These factors can be adjusted to achieve a metal layer with specific properties, such as a particular thickness, width, texture, aesthetic, morphology, roughness, conductivity and catalytic activity.

The resulting metal layer may be in the form of metal nanocrystals having various size, including smaller crystals between 1 and 1000 nm in size, larger crystals or clusters of crystals up to 50 μm in size, and polycrystalline layer with thickness between 30 and 5000 nm. The nanocrystal size can be controlled by the choice of substrate, composition of crystal growth ink, concentration of metal ionic precursor within the crystal growth ink, gas flow within the chamber, and exposure time of the substrate to the plasma. Further, the nanocrystal shape can be controlled by the choice of substrate, composition of crystal growth ink, and choice of metal ionic precursor. The layer thickness or interconnectivity can be controlled by the choice of composition of the crystal growth ink, concentration of the metal ionic precursor within the crystal growth ink, the plasma flow, and exposure time.

In some embodiments the spread of nanocrystals may cause catalytic activity, depending on the metal they are comprised of. For example, platinum nanocrystals may decompose hydrogen peroxide into oxygen and hydrogen. In a further example, silver nanocrystals may catalyze the conversion of oxygen to hydroxide ions.

In some embodiments the interconnected network of nanocrystals and the full polycrystalline metal layer show a high conductivity, allowing for application to the field of electronics or optoelectronics. The conductivity can be above 5 of bulk conductivity. For example, a silk mesh coated with silver crystalline metal layer may exhibit a conductivity of 12% bulk silver. Paper with a silver metal layer printed on its surface may exhibit a conductivity of 40% bulk silver.

Following are a few non-limiting examples for crystal growth ink compositions and methods of forming metal layers for specific applications using such compositions.

Example I. The crystal growth ink includes the metal ionic precursor $AgNO_3$ with a concentration of 10 wt. % of the crystal growth ink. The structuring liquid includes propylene glycol at 20 wt. % and ethylene glycol at 60 wt. %. The spreading liquid is 0%. The stabilizing liquid is water at 10 wt. %, and there are no additives. A plastic concave shape is immersed in the crystal growth ink and soaked for 1 minute. The coated plastic concave substrate is then placed in a vacuum chamber and exposed to argon plasma. In this example, the chamber is set with the following exposure parameters for power, gas flow rate, and time: RF frequency of 13.56 MHz, 50 W of power, 20 SCCM gas flow rate, and 15 minutes of exposure, respectively. The pressure within the chamber is 0.6 millibar (mbar). As a result, the plastic concave substrate is coated with a continuous, uniform, polycrystalline layer of silver nanoparticles having a size of 70 nm, which may be used for electronic applications, such as a base material for a plastic antenna. FIG. 1 shows a similar substrate of a curved glass shape coated in a layer of gold.

Figure 2:
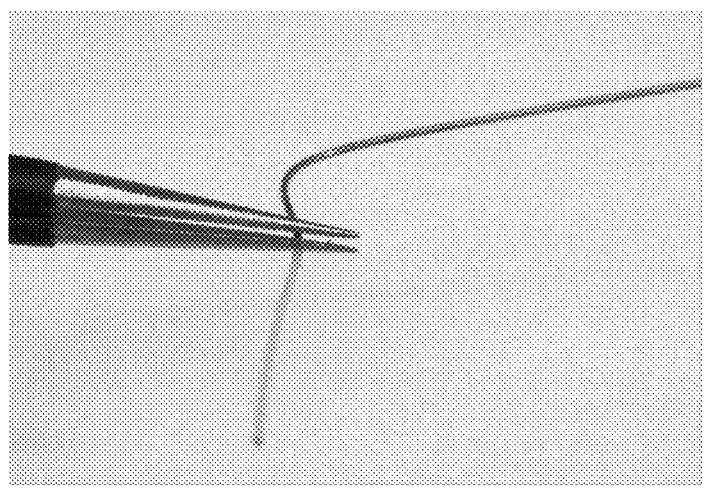
FIG. 2 is a photograph image of a silver layer formed on a polyethylene wire using the disclosed process.
Figure 3:
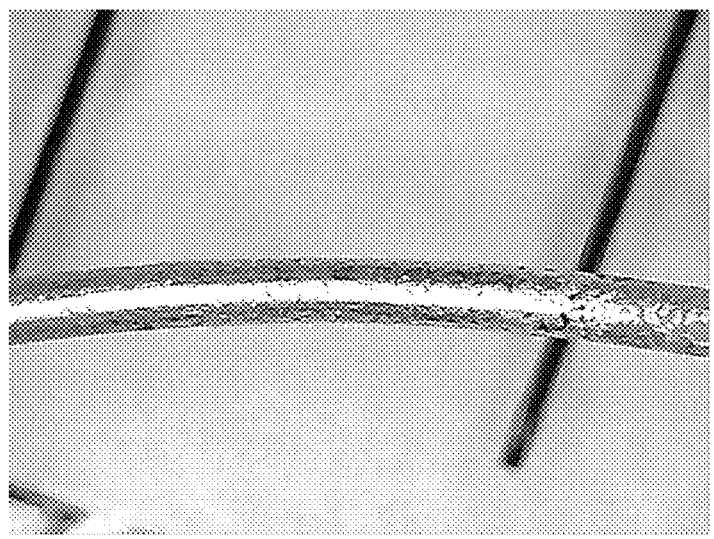
FIG. 3 is an optical microscope image of a silver layer formed on a polyethylene wire using the disclosed process.

Example II. The crystal growth ink includes the metal ionic precursor $HAuCl_4$ with a concentration of 20 wt. % of the crystal growth ink. The structuring liquid includes Dowanol™ DPM (Dipropylene glycol methyl ether) 16 wt. %. The spreading liquid is propanol at 32 wt. %. The stabilizing liquid is water at 30 wt. %. The additive is BYK®-4500 (Ethenyl copolymer) 2%. The crystal growth ink is applied to a nylon fabric using drop-casting and a mask. The crystal growth ink coated fabric is then placed in a vacuum chamber and exposed to Argon plasma. In this example, the chamber is set with the following exposure parameters for power, gas flow rate, and time: RF frequency of 13.56 MHz, 150 W of power, 25 SCCM gas flow rate, and 10 minutes of exposure, respectively. The pressure within the chamber is 0.6 mbar. As a result, the fabric substrate is coated with a continuous layer of gold nanoparticles of 100 nm size, and is later used for medical applications, as a base material for a wearable sensor. FIGS. 2 and 3 show a photograph and an optical microscope image, respectively of a similar substrate of a silver coated polyethylene wire.

Figure 4:
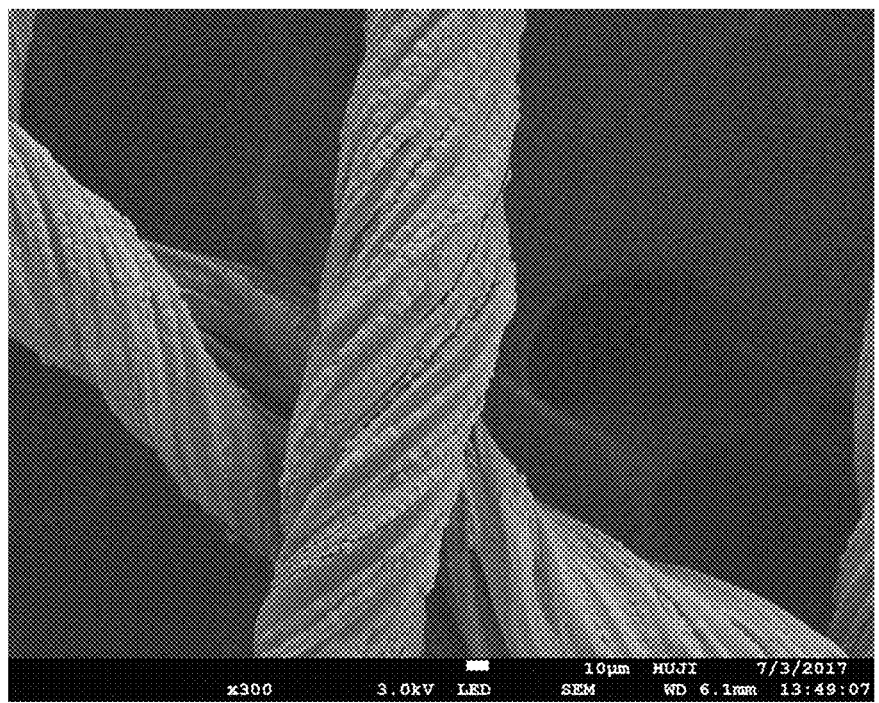
FIG. 4 is a scanning microscopy image of a silver layer formed on a silk fiber using the disclosed process.
Figure 5:
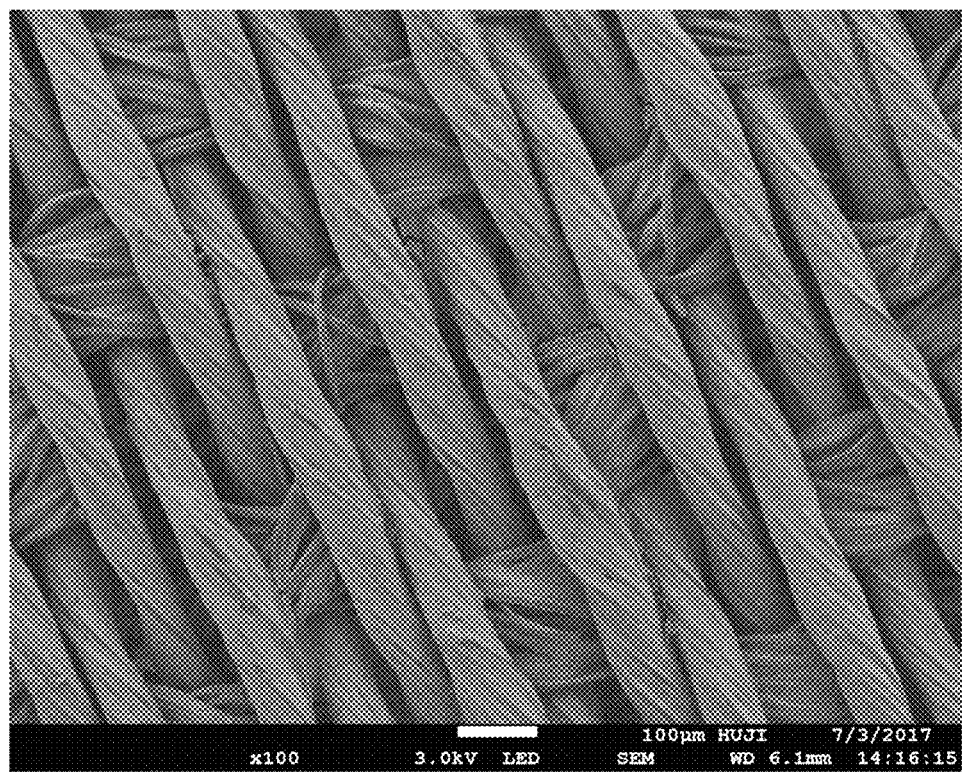
FIG. 5 is a scanning microscopy image of a silver layer formed on silk woven fabric using the disclosed process.

Example III. The crystal growth ink includes the metal ionic precursor $AgNO_3$ with a concentration of 29.2 wt. % of the crystal growth ink. The structuring liquid includes ethylene glycol at 31.8 wt. %. The spreading liquid is ethanol at 7.1 wt. % and Dowanol™ PM (Propylene glycol methyl ether) at 5.3 wt %. The stabilizing liquid is water at 26.5 wt. %, with no additives. The crystal growth ink is printed on a nylon fabric using an inkjet printer. The crystal growth ink coated nylon fabric is then placed in a vacuum chamber and exposed to argon plasma. In this example, the chamber is set with the following exposure parameters for power, gas flow rate, and time: RF frequency of 13.56 MHz, 150 W of power, 30 SCCM gas flow rate, and 15 minutes of exposure, respectively. The pressure within the chamber is 0.5 mbar. As a result, the fabric substrate is coated with a continuous silver polycrystalline layer, and is later used for electrical applications. FIGS. 4 and 5 show scanning electron microscope images of a similar substrate of a silver-coated single silk wire, and silk woven fabric respectively.

Figure 9:
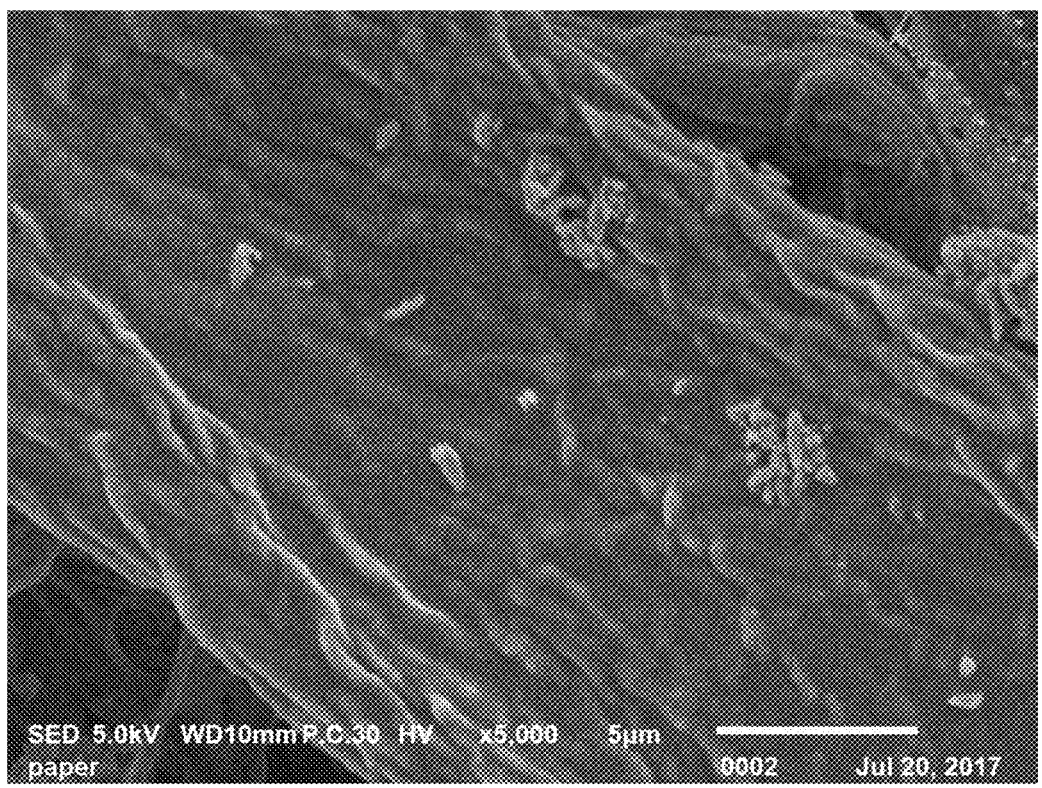
FIG. 9 is a scanning microscopy image of cellulose paper coated with a silver layer.

Example IV. The crystal growth ink includes metal ionic precursor $AgNO_3$ with a concentration of 46.2 wt. % of the crystal growth ink. The structuring liquid includes ethylene glycol at 24.8 wt. %. The spreading liquid is ethanol at 2.7 wt. %, and Dowanol™ PM (Propylene glycol methyl ether) at 4.2 wt. %. The stabilizing liquid is water at 22.0 wt. %, with no additives. The crystal growth ink is printed on paper using an inkjet printer. The crystal growth ink coated paper is then placed in a vacuum chamber and exposed to argon plasma. In this example, the chamber is set with the following exposure parameters for power, gas flow rate, and time: RF frequency of 13.56 MHz, 150 W of power, 20 SCCM gas flow rate, and 10 minutes of exposure respectively. The pressure within the chamber is 0.5 mbar. As a result, the paper fibers are coated with a continuous silver polycrystalline layer, where the paper substrate may be used for electrical applications. FIG. 9 shows a scanning electron microscope image of a sheet of paper coated with a silver layer.

Example V. The crystal growth ink includes the metal ionic precursor $AgC_2H_3O_2$ with a concentration of 20 wt. % of the crystal growth ink. The structuring liquid is Dowanol™ DPM (Dipropylene glycol methyl ether) at 50 wt. %. The spreading liquid is n-propanol at 20 wt. %. The stabilizing liquid is water 10 wt. %, with no additives. A polytetrafluoroethylene (PTFE) 3D structure is immersed in the crystal growth ink for 10 seconds. The crystal growth ink coated PTFE structure is then placed in a vacuum chamber and exposed to argon plasma. In this example, the chamber is set with the following exposure parameters for power, gas flow rate, and time: RF frequency of 13.56 MHz, 150 W of power, 25 SCCM gas flow rate, and 15 minutes of exposure, respectively. The pressure within the chamber is 0.8 mbar. As a result, a PTFE structure is coated inside and covered outside by a layer of silver nanoparticles having a size of 50 nm, which can be used in a 3D antenna.

Figure 6:
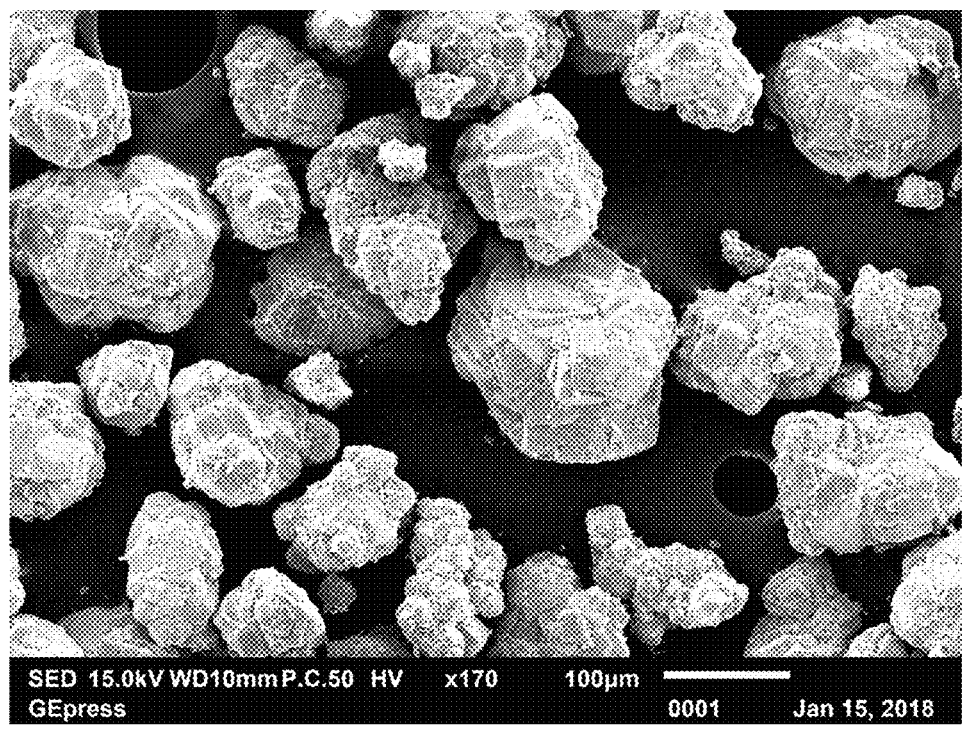
FIG. 6 is a scanning microscopy image of $Al_2O_3$ powder coated with an interconnected layer of silver nanocrystals.
Figure 7:
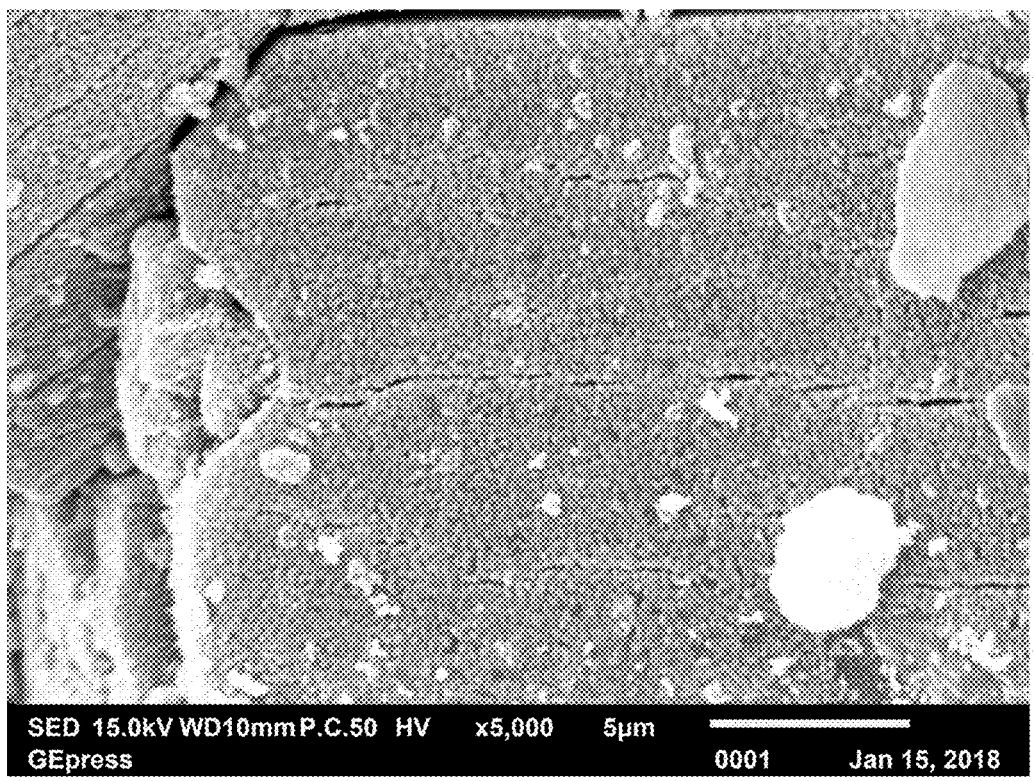
FIG. 7 is a scanning microscopy image of a single $Al_2O_3$ microparticle fully covered with a layer of silver nanocrystals.
Figure 8:
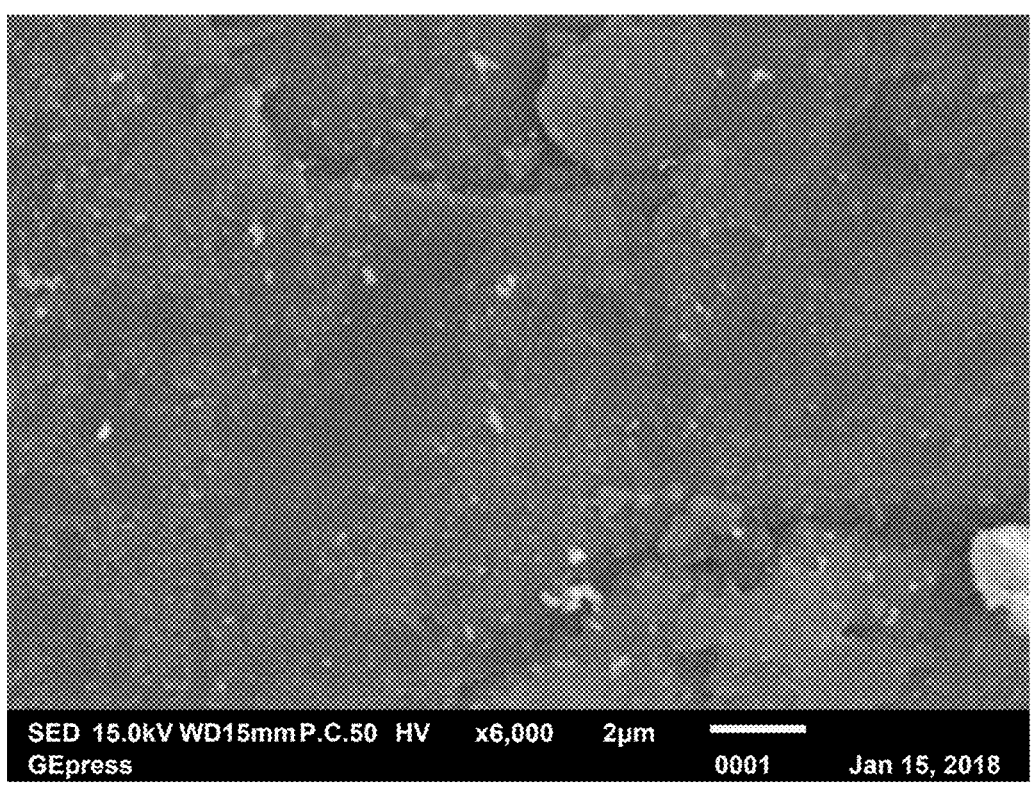
FIG. 8 is a scanning microscopy image of a single $Al_2O_3$ microparticle partially covered with a layer of silver nanocrystals.

Example VI. The crystal growth ink includes the metal ionic precursor $AgNO_3$ with a concentration of 10 wt. % of the crystal growth ink. The structuring liquid is ethylene glycol at 20 wt. %. The spreading liquid is ethanol at 40 wt. %. The stabilizing liquid is ethylene glycol at 20 wt. %, with no additives. Alumina ($Al_2O_3$) mesh 400 powder is soaked with the crystal growth ink. The soaked powder is then placed in a vacuum chamber and exposed to argon plasma. In this example, the chamber is set with the following exposure parameters for power, gas flow rate, and time: RF frequency of 13.56 MHz, 150 W of power, 20 SCCM gas flow rate, and 10 minutes of exposure, respectively. The pressure within the chamber is 0.3 mbar. As a result, an alumina powder is partially coated with silver nanoparticles of having a size of 20-70 nm, which can be further used as a catalyst precursor. FIGS. 6, 7, and 8 show scanning electron microscope images of $Al_2O_3$ microparticles coated with a silver layer. Specifically, FIG. 6 is a microscopy image of $Al_2O_3$ powder with mesh 150 coated with ab interconnected layer of silver nanocrystals; FIG. 7 is a microscopy image of a single $Al_2O_3$ microparticle fully covered with a layer of silver nanocrystals having a 100 nanometer; and FIG. 8 is an image of a single $Al_2O_3$ microparticle partially covered with a layer having of silver nanocrystals having thickness of about 70 nanometer.

Example VII. The crystal growth ink includes the metal ionic precursor $HAuCl_4$ with a concentration of 20 wt. % of the crystal growth ink. The structuring liquid is Dowanol™ DPM (Dipropylene glycol methyl ether) at 16 wt. %. The spreading liquid is propanol at 32 wt. %. The stabilizing liquid is water at 30 wt. %. The additive is BYK®-4500 (Ethenyl copolymer) 2%. The crystal growth ink is spread on a silk fabric using drop-casting and a mask. The coated fabric substrate is then placed in a vacuum chamber and exposed to argon plasma. In this is example, the he chamber is set with the following exposure parameters for power, gas flow rate, and time: RF frequency of 13.56 MHz, 150 W of power, 25 SCCM gas flow rate, and 10 minutes of exposure respectively. The pressure within the chamber is 0.6 mbar. As a result, the fabric substrate is coated with a continuous layer of gold nanoparticles of 100 nm size with conductivity of 50% of bulk, and may be used for medical applications, for example as a base material for a wearable sensor.

Example VIII. The crystal growth ink includes the metal ionic precursor $AgNO_3$ with a concentration of 9 wt. % of the crystal growth ink. The structuring liquid is Dowanol™ PM (Propylene glycol methyl ether) at 16 wt. %. The spreading liquid is propanol at 32 wt. %. The stabilizing liquid is water at 30 wt. %, with no additives. The crystal growth ink is spread on a cashmere fabric using drop-casting and a mask. The coated fabric substrate is then placed in a vacuum chamber and exposed to argon plasma. In this example, the chamber is set with the following exposure parameters for power, gas flow rate, and time: RF frequency of 13.56 MHz, 150 W of power, 30 SCCM gas flow rate, and 15 minutes of exposure, respectively. The pressure within the chamber is 0.5 mbar. As a result, the fabric substrate is coated with an interconnected network of silver nanoparticles having a size of 50 nm, forming larger clusters of several microns in size, which may be used for medical applications, such as a base material for a bacteria resistant wearable.

Example IX. The crystal growth ink includes the metal ionic precursor $AgNO_3$ with a concentration of 36.8 wt. % of the crystal growth ink. The structuring liquid includes ethylene glycol at 24.3 wt. %. The spreading liquid is ethanol at 7.1 wt. % and Dowanol™ PM (Propylene glycol methyl ether) at 5.3 wt %. The stabilizing liquid is water at 26.5 wt. %, with no additives. The crystal growth ink is spread on a neoprene fabric using aerosol spraying. Then, the fabric substrate with crystal growth ink is placed in a vacuum chamber and exposed to argon plasma. In this example, the chamber is set with the following exposure parameters for power, gas flow rate, and time: RF frequency of 13.56 MHz, 150 W of power, 20 SCCM gas flow rate, and 20 minutes of exposure respectively. The pressure within the chamber is 0.7 mbar. As a result, fabric substrate is coated with a continuous layer of silver nanoparticles of 120 nm size with conductivity of 20% of bulk, and is later used a base material for a wearable transistor.

Example X. The crystal growth ink includes the metal ionic precursor $AgNO_3$ with a concentration of 0.1 wt. % of the crystal growth ink. The structuring liquid is ethylene glycol at 37% wt. % and propylene glycol at 33%. The spreading liquid is ethanol at 29.9 wt. %. There is no stabilizing liquid or any additives. The crystal growth ink is spread on a polyester fabric using complete immersion of the fabric into the ink for 1 minute. The coated fabric substrate is placed in a vacuum chamber and exposed to argon plasma. In this example, the chamber is set with the following exposure parameters for power, gas flow rate, and time: RF frequency of 13.56 MHz, 150 W of power, 30 SCCM gas flow rate, and 20 minutes of exposure, respectively. The pressure within the chamber is 0.8 mbar. As a result, the fabric substrate is coated with a spread layer of silver nanoparticles of 50-150 nm size, which may be used for antibacterial applications.

Example XI. The crystal growth ink includes the metal ionic precursor $AgNO_3$ with a concentration of 15.3 wt. % of the crystal growth ink. The structuring liquid includes propylene glycol at 45.5 wt. %. The spreading liquid is ethanol at 7.1 wt. % and Dowanol™ PM (Propylene glycol methyl ether) at 5.3 wt. %. The stabilizing liquid is water at 26.5 wt. %. The additive is BYK®-4500 (Ethenyl copolymer) at 0.3 wt. %. The crystal growth ink is spread on a polyester fabric using complete immersion of the fabric into the ink for 1 minute. The soaked fabric substrate is placed in a vacuum chamber and exposed to argon plasma. In this example, the chamber is set with the following exposure parameters for power, gas flow rate, and time: RF frequency of 13.56 MHz, 150 W of power, 35 SCCM gas flow rate, and 15 minutes of exposure, respectively. The pressure within the chamber is 0.8 mbar. As a result, fabric substrate is coated with a continuous layer of silver nanoparticles of 100-150 nm size, which may be used for antistatic and shielding applications.

Example XII. The crystal growth ink includes the metal ionic precursor $AgNO_3$ with a concentration of 1 wt. % of the crystal growth ink. The structuring liquid is propylene glycol at 37 wt. %. The spreading liquid is Dowanol™ PM (Propylene glycol methyl ether) at 32 wt. %. The stabilizing liquid is ethylene glycol at 30 wt. %. There are no additives. Titanium oxide ($TiO_2$) particles of the size of 1-2 micrometers are mixed in and soaked with the crystal growth ink. The particles are then placed in a vacuum chamber and exposed to argon plasma. In this example, the chamber is set with the following exposure parameters for power, gas flow rate, and time: RF frequency of 13.56 MHz, 150 W of power, 20 SCCM gas flow rate, and 10 minutes of exposure, respectively. The pressure within the chamber is 0.6 mbar. The process is repeated three times. As a result, the titanium oxide particles are partially coated with a network of silver nanoparticles having a size of 100 nm or less which conduct electricity when pressed together. The coated powder may be used for catalytic applications.

Example XIII. The crystal growth ink includes the metal ionic precursor $HAuCl_4$ with a concentration of 5 wt. % of the crystal growth ink. The structuring liquid is ethylene glycol at 41 wt. %. The spreading liquid is propanol at 32 wt. %. The stabilizing liquid is water 22 at wt. %. There are no additives. Titanium nitride (TiN) particles of the size of 2-4 micrometers are mixed in and soaked with the crystal growth ink. The soaked particles are placed in a vacuum chamber and exposed to argon plasma. In this example, the chamber is set with the following exposure parameters for power, gas flow rate, and time: RF frequency of 13.56 MHz, 150 W of power, 25 SCCM gas flow rate, and 5 minutes of exposure respectively. The pressure within the chamber is 0.6 mbar. The process is repeated four times. As a result, the titanium nitride particles are partially coated with a network of gold nanoparticles of 20-40 nm size and may be used for catalytic applications.

Example XIV. The crystal growth ink includes the metal ionic precursor $AgNO_3$ with a concentration of 12 wt. % of the crystal growth ink. The structuring liquid is ethylene glycol at 15 wt. %, and propylene glycol at 22 wt. %. The spreading liquid is ethanol at 22 wt. %. The stabilizing liquid is ethylene glycol at 29 wt. %. There are no additives. Polyethylene microparticles with a mean size of 40 micrometers are mixed in and soaked with the crystal growth ink. The soaked particles are then placed in a vacuum chamber and exposed to argon plasma. In this example, the chamber is set with the following exposure parameters RF frequency, power, gas flow rate, and time having the values: 13.56 MHz, 150 W, 30 SCCM gas flow rate, and 15 minutes, respectively. The pressure within the chamber is 0.4 mbar. The process is repeated three times. As a result, the polyethylene microparticles are fully coated with a layer of silver nanoparticles of 200 nm thickness and may conduct electricity when pressed together. The coated particles may be used for catalytic applications.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A method for forming a crystalline metal layer on a three-dimensional (3D) substrate, comprising:
applying crystal growth ink to a surface of the 3D substrate, wherein the crystal growth ink includes a metal ionic precursor and a mixture of a spreading liquid having a surface tension between 10 and 40 millinewton per meter (mN/m) and a structuring liquid having a dynamic viscosity between 10-1000 centipoise (cP) and a vapor pressure between 0-100 pascals (Pa); and
exposing the crystal growth ink to low temperature radio frequency (RF) plasma irradiation in a vacuum environment to cause the growing of a crystalline metal layer on the 3D substrate, wherein the exposure is based on a set of predefined exposure parameters;
wherein the metal ionic precursor is $HAuCl_4$ with a concentration ranging from 5 wt. % and 20 wt. %;
wherein the structuring liquid comprises at least one of Dipropylene glycol methyl ether with a concentration of 16 wt. % and Ethylene glycol with a concentration of 41 wt. %;
wherein the spreading liquid comprises Propanol with a concentration of 32 wt. %; and
wherein the set of predefined exposure parameters includes RF frequency of 13.56 MHz, 150 W of power, 25 SCCM gas flow rate, and the pressure within a chamber is 0.6 mbar; resulting in a continuous layer of gold nanoparticles ranging from 20 to 100 nm in size.

2. The method of claim 1, wherein the exposure to the plasma causes the crystal growth ink to undergo a reduction process where the structuring liquid from the crystal growth ink evaporates and where metal ions from the metal ionic precursor receive electrons from the plasma, converting the metal ions to metal atoms and forming a crystalline metal layer on the 3D substrate.

3. The method of claim 1, wherein the crystalline metal layer comprises at least one of: a crystalline, a polycrystalline and a semicrystalline layer.

4. The method of claim 1, wherein the crystalline metal layer comprises at least one of: a spread of separate nanocrystals, a spread of clusters of nanocrystals, an interconnected network of nanocrystals, an interconnected network of nanocrystal clusters, and a full uniform polycrystalline metal layer.

5. The method of claim 1, wherein the form of the crystal growth ink composition is any one of: a solution, a dispersion, a suspension, a gel, and colloid.

6. The method of claim 1, wherein the structuring liquid further comprises at least one of: a cyclic alcohol, a sulfoxide, a formamide, an ethylamine, a diol, a glycol, a glycol ether, a glycerol, and a propylene carbonate.

7. The method of claim 1, wherein the spreading liquid further comprises at least one of: an alcohol, a toluene, a dioxane, a sulfoxide, a formamide, an ethylamine, a glycol ether, and an acetonitrile.

8. The method of claim 1, wherein the crystal growth ink further comprises a stabilizing liquid that comprises at least one of: water, a tetrahydrofurane, a dioxane, a cyclic alcohol, a sulfoxide, a formamide, an ethylamine, a glycol, a glycerol, a propylene carbonate, and an acetonitrile.

9. The method of claim 1, wherein the crystal growth ink is applied to the substrate by at least one of the following procedures: drop-casting, spray-coating, immersion, printing, mixing, and soaking.

10. The method of claim 1, wherein exposing the substrate to the plasma irradiation further comprises:
setting the set of predefined exposure parameters, the parameters including: plasma power, plasma frequency, and time of exposure.

11. The method of claim 1, wherein additives comprise up to 5% by weight of the crystal growth ink, and further comprises at least one of: solvents, organic molecules, oxidants, reductants, acids, bases, stabilizers, polymers, conductive polymers, microparticles, nanoparticles, carbon nanotubes (CNT), densifiers, surfactants, propellants, dispersing agents, binder resins, adhesion promoters, wetting agents, and leveling agents.

12. The method of claim 1, wherein the 3D substrate comprises at least one of: curved surface, fiber, fiber bundle, papers, nonwoven, fabric, microparticle, nanoparticle, and powder.

13. The method of claim 1, wherein the plasma comprises: the ionized gas consisting of the group of: argon, nitrogen, oxygen, hydrogen, air, helium, neon, xenon, ammonia, ethane ($C_2H_6$), carbon dioxide, carbon monoxide, methane ($CH_4$), propane ($C_3H_8$), silane ($SiH_4$), nitrogen dioxide, nitrogen monoxide and their combinations.

14. The method of claim 1, wherein the thickness of the applied crystal growth ink on the substrate is up to 2 millimeters.

15. The method of claim 1, wherein the metal crystalline layer possesses catalytic activity, wherein the catalytic activity depends on the metal layer.

16. A method for forming a crystalline metal layer on a three-dimensional (3D) substrate, comprising:
applying crystal growth ink to a surface of the 3D substrate, wherein the crystal growth ink includes a metal ionic precursor and a mixture of a spreading liquid having a surface tension between 10 and 40 millinewton per meter (mN/m) and a structuring liquid having a dynamic viscosity between 10-1000 centipoise (cP) and a vapor pressure between 0-100 pascals (Pa); and
exposing the crystal growth ink to low temperature radio frequency (RF) plasma irradiation in a vacuum environment to cause the growing of a crystalline metal layer on the 3D substrate, wherein the exposure is based on a set of predefined exposure parameters;
wherein the metal ionic precursor is $AgNO_3$ with a concentration ranging from 0.1 wt. % and 50 wt. %;
wherein the structuring liquid comprises at least one of Propylene glycol with a concentration ranging from 20 wt. % to 50 wt. % and Ethylene glycol with a concentration ranging from 15 wt. % to 60 wt. %,
wherein the spreading liquid comprises at least one of Ethanol with a concentration ranging from
2.5 wt. % to 40 wt. %, Propanol with a concentration of 32 wt. %, and Propylene glycol methyl ether with a concentration ranging from 4.2 wt. % to 32 wt. %; and
wherein the set of predefined exposure parameters includes RF frequency of 13.56 MHz, 50-150 W of power, 20-40 SCCM gas flow rate, and the pressure within a chamber is 0.5-0.6 mbar; resulting in a continuous layer of silver nanoparticles ranging from 20 to 100 nm in size.

17. The method of claim 16, wherein the exposure to the plasma causes the crystal growth ink to undergo a reduction process where the structuring liquid from the crystal growth ink evaporates and where metal ions from the metal ionic precursor receive electrons from the plasma, converting the metal ions to metal atoms and forming a crystalline metal layer on the 3D substrate.

18. The method of claim 16, wherein the crystalline metal layer comprises at least one of: a crystalline, a polycrystalline and a semicrystalline layer.

19. The method of claim 16, wherein the crystalline metal layer comprises at least one of: a spread of separate nanocrystals, a spread of clusters of nanocrystals, an interconnected network of nanocrystals, an interconnected network of nanocrystal clusters, and a full uniform polycrystalline metal layer.

20. The method of claim 16, wherein the form of the crystal growth ink composition is any one of: a solution, a dispersion, a suspension, a gel, and colloid.

21. The method of claim 16, wherein the structuring liquid further comprises at least one of: a cyclic alcohol, a sulfoxide, a formamide, an ethylamine, a diol, a glycol, a glycol ether, a glycerol, and a propylene carbonate.

22. The method of claim 16, wherein the spreading liquid further comprises at least one of: an alcohol, a toluene, a dioxane, a sulfoxide, a formamide, an ethylamine, a glycol ether, and an acetonitrile.

23. The method of claim 16, wherein the crystal growth ink further comprises a stabilizing liquid that comprises at least one of: water, a tetrahydrofurane, a dioxane, a cyclic alcohol, a sulfoxide, a formamide, an ethylamine, a glycol, a glycerol, a propylene carbonate, and an acetonitrile.

24. The method of claim 16, wherein the crystal growth ink is applied to the substrate by at least one of the following procedures: drop-casting, spray-coating, immersion, printing, mixing, and soaking.

25. The method of claim 16, wherein exposing the substrate to the plasma irradiation further comprises:
setting the set of predefined exposure parameters, the parameters including: plasma power, plasma frequency, and time of exposure.

26. The method of claim 16, wherein additives comprise up to 5% by weight of the crystal growth ink, and further comprises at least one of: solvents, organic molecules, oxidants, reductants, acids, bases, stabilizers, polymers, conductive polymers, microparticles, nanoparticles, carbon nanotubes (CNT), densifiers, surfactants, propellants, dispersing agents, binder resins, adhesion promoters, wetting agents, and leveling agents.

27. The method of claim 16, wherein the 3D substrate comprises at least one of: curved surface, fiber, fiber bundle, papers, nonwoven, fabric, microparticle, nanoparticle, and powder.

28. The method of claim 16, wherein the plasma comprises: the ionized gas consisting of the group of: argon, nitrogen, oxygen, hydrogen, air, helium, neon, xenon, ammonia, ethane ($C_2H_6$), carbon dioxide, carbon monoxide, methane ($CH_4$), propane ($C_3H_8$), silane ($SiH_4$), nitrogen dioxide, nitrogen monoxide and their combinations.

29. The method of claim 16, wherein the thickness of the applied crystal growth ink on the substrate is up to 2 millimeters.

30. The method of claim 16, wherein the metal crystalline layer possesses catalytic activity, wherein the catalytic activity depends on the metal layer.

* * * * *